United States Patent
Kaseya

(10) Patent No.: US 10,620,517 B2
(45) Date of Patent: Apr. 14, 2020

(54) PROJECTOR HAVING A METAL ELECTRODE ON THE TRANSPARENT ELECTRODE WITH GAP REGIONS TO PREVENT SHADOWING

(71) Applicant: Seiko Epson Corporation, Tokyo (JP)

(72) Inventor: Hiroyasu Kaseya, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/414,037

(22) Filed: May 16, 2019

(65) Prior Publication Data

US 2019/0353999 A1 Nov. 21, 2019

(30) Foreign Application Priority Data

May 17, 2018 (JP) .................. 2018-095099

(51) Int. Cl.

| G02F 1/1335 | (2006.01) |
| H04N 9/31 | (2006.01) |
| G03B 21/20 | (2006.01) |
| G03B 21/00 | (2006.01) |
| H01L 33/38 | (2010.01) |
| H01L 33/06 | (2010.01) |
| H01L 33/32 | (2010.01) |

(52) U.S. Cl.
CPC ....... G03B 21/2033 (2013.01); G03B 21/006 (2013.01); G03B 21/208 (2013.01); H01L 33/06 (2013.01); H01L 33/32 (2013.01); H01L 33/387 (2013.01)

(58) Field of Classification Search
CPC ........... G03B 21/2033; G03B 21/208; G03B 21/006; H01L 33/06; H01L 33/32; H01L 33/387
See application file for complete search history.

(56) References Cited

U.S. PATENT DOCUMENTS 10,372,025 B2 * 8/2019 Matsumoto .......... G03B 21/145
2012/0162613 A1 * 6/2012 Liu .................... G02B 27/1006
353/31

(Continued)

FOREIGN PATENT DOCUMENTS

| JP | 2000-075406 A | 3/2000 |
| JP | 2009-237011 A | 10/2009 |
| JP | 2015-153928 A | 8/2015 |

*Primary Examiner* — Tracie Y Green

(74) *Attorney, Agent, or Firm* — Harness, Dickey & Pierce, P.L.C.

(57) ABSTRACT

A projector includes a light emitting device and a light modulator. The light emitting device includes first and second semiconductor layers respectively electrically connected to first and second electrodes, a light emitting layer generating light by having a current injected thereinto, and a third electrode connected to the second electrode. The second electrode transmits the light generated in the light emitting layer. The third electrode has less resistivity than the second electrode, and includes first conductive sections arranged in a first direction. The light modulator includes pixels, and adjacent pixels are spaced apart by gaps. The arrangement pitch of the first conductive sections in the first direction is a multiple of the arrangement pitch of the gaps in the first direction. The shadows of the first conductive sections generated by the light emitted from the light emitting device are cast onto the gaps.

7 Claims, 13 Drawing Sheets

(56) References Cited

U.S. PATENT DOCUMENTS

| | | | |
|---|---|---|---|
| 2012/0229775 A1* | 9/2012 | Itoh | G02B 27/0961 |
| | | | 353/30 |
| 2015/0236207 A1 | 8/2015 | Emura | |
| 2019/0082151 A1* | 3/2019 | Kishimoto | H04N 9/3108 |
| 2019/0101811 A1* | 4/2019 | Tamura | G03B 21/147 |
| 2019/0198560 A1* | 6/2019 | Kaseya | H01L 25/0753 |

* cited by examiner

PROJECTOR HAVING A METAL ELECTRODE ON THE TRANSPARENT ELECTRODE WITH GAP REGIONS TO PREVENT SHADOWING

The present application is based on and claims priority from Japanese Patent Application Serial Number 2018-095099, filed May 17, 2018, the disclosure of which is hereby incorporated by reference herein in its entirety.

BACKGROUND

1. Technical Field

The present disclosure relates to a projector.

2. Related Art

As a light source of a projector, a light emitting device that includes a plurality of semiconductor layers stacked on each other and that emits light in the stacking direction has been known. In the light emitting device, for example, a transparent electrode transmitting light is used as an electrode, and the light is extracted from the transparent electrode side.

For example, JP-A-2000-75406 discloses a liquid crystal projector in which indium tin oxide (ITO) is used as a transparent electrode and light is extracted from the ITO side.

JP-A-2000-75406 is an example of the related art.

The material used as a transparent electrode such as ITO described above generally has a high resistance, and therefore, a desired current may not be injected into the entire light emitting region. Therefore, for example, it is considered to provide a metal layer having a low resistance on the transparent electrode to reduce the resistance. However, the metal layer blocks light generated in a light emitting layer; therefore, for example, when the shadow of the metal layer is cast on a pixel of a liquid crystal light valve, the shadow of the metal layer appears on an illumination object such as a screen.

SUMMARY

An aspect of a projector according to the present disclosure includes: a light emitting device; and a light modulator modulating, in response to image information, light emitted from the light emitting device, wherein the light emitting device includes a first semiconductor layer, a second semiconductor layer of a conductivity type different from that of the first semiconductor layer, a light emitting layer that is provided between the first semiconductor layer and the second semiconductor layer and that generates light by injection of a current, a first electrode electrically connected to the first semiconductor layer, a second electrode electrically connected to the second semiconductor layer, and a third electrode connected to the second electrode, the second electrode transmits the light generated in the light emitting layer, a resistivity of the third electrode is lower than a resistivity of the second electrode, the third electrode includes a plurality of first conductive sections arranged in a first direction, the light modulator includes a plurality of pixels and a gap region between the pixels adjacent to each other, an arrangement pitch of the plurality of first conductive sections in the first direction is an integer multiple of an arrangement pitch of a plurality of the gap regions in the first direction, and a shadow of the first conductive section generated by the light emitted from the light emitting device is cast on the gap region.

In the aspect of the projector, the third electrode may include a plurality of second conductive sections arranged in a second direction crossing the first direction, an arrangement pitch of the plurality of second conductive sections in the second direction may be an integer multiple of an arrangement pitch of the plurality of gap regions in the second direction, and a shadow of the second conductive section generated by the light emitted from the light emitting device may be cast on the gap region.

Another aspect of a projector according to the present disclosure includes: a light emitting device; a light modulator modulating, in response to image information, light emitted from the light emitting device; and a lens system directing the light emitted from the light emitting device to the light modulator, wherein the light emitting device includes a first semiconductor layer, a second semiconductor layer of a conductivity type different from that of the first semiconductor layer, a light emitting layer that is provided between the first semiconductor layer and the second semiconductor layer and that generates light by injection of a current, a first electrode electrically connected to the first semiconductor layer, a second electrode electrically connected to the second semiconductor layer, and a third electrode connected to the second electrode, the second electrode transmits the light generated in the light emitting layer, a resistivity of the third electrode is lower than a resistivity of the second electrode, the third electrode includes a plurality of first conductive sections arranged in a first direction, the light modulator includes a plurality of pixels and a gap region between the pixels adjacent to each other, an arrangement pitch of the plurality of first conductive sections in the first direction is an integer multiple of a value obtained by multiplying an arrangement pitch of a plurality of the gap regions in the first direction by a magnification of the lens system, and a shadow of the first conductive section generated by the light emitted from the light emitting device is cast on the gap region.

In the aspect of the projector, the third electrode may include a first portion in which the arrangement pitch of the plurality of first conductive sections in the first direction is a first pitch and a second portion in which the arrangement pitch of the plurality of first conductive sections in the first direction is a second pitch smaller than the first pitch, and in a plan view as viewed in a stacking direction of the first semiconductor layer and the light emitting layer, a distance between the second portion and a center of the second electrode may be smaller than a distance between the first portion and the center of the second electrode.

In the aspect of the projector, the arrangement pitch of the plurality of first conductive sections in the first direction may be the same as the arrangement pitch of the plurality of gap regions in the first direction.

In the aspect of the projector, a distance between the first conductive sections adjacent to each other may be smaller than a size of the pixel in the first direction.

In the aspect of the projector, the light modulator may include a condensing lens directing the light emitted from the light emitting device to the pixel, and a distance between the first conductive sections adjacent to each other may be larger than a size of the pixel in the first direction.

DESCRIPTION OF EXEMPLARY EMBODIMENTS

Hereinafter, preferred embodiments of the present disclosure will be described in detail with reference to the drawings. The embodiments described below do not unduly limit the details of the present disclosure set forth in the appended claims. Moreover, not all of the configurations described below are essential configuration requirements of the present disclosure.

1. First Embodiment 1.1. Projector

Figure 1:
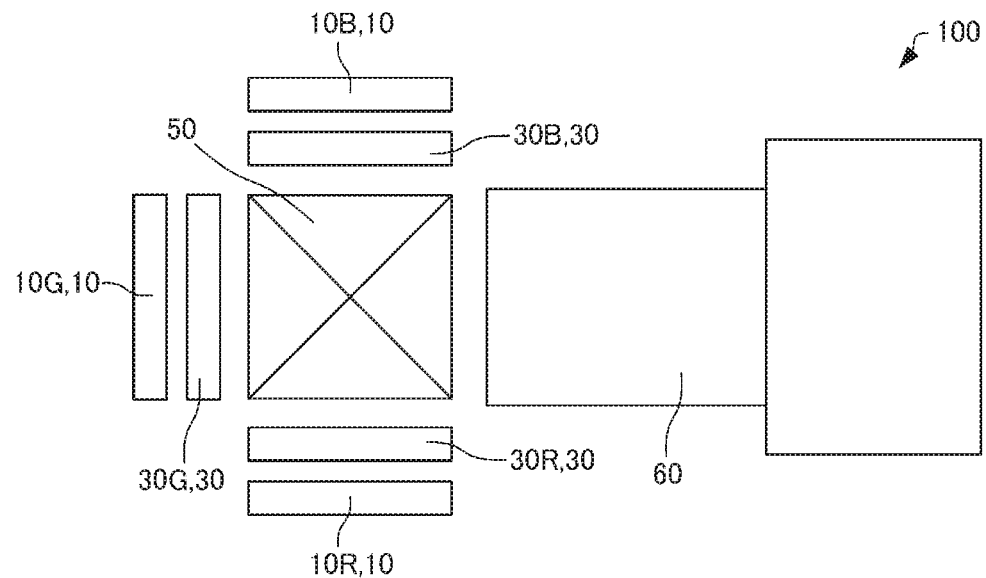
FIG. 1 is a diagram schematically showing a projector according to a first embodiment.

First, a projector according to a first embodiment will be described with reference to the drawings. FIG. 1 is a cross-sectional view schematically showing the projector 100 according to the first embodiment.

As shown in FIG. 1, the projector 100 includes, for example, a light emitting device 10, a transmissive liquid crystal light valve (light modulator) 30, a cross dichroic prism (color light combining device) 50, a projection lens (projection device) 60, and a housing (not shown) to accommodate these components. For convenience sake, the light emitting device 10 and the liquid crystal light valve 30 are illustrated in a simplified manner in FIG. 1.

The light emitting device 10 emits light. In the illustrated example, the projector 100 includes, as the light emitting device 10, a red light source 10R emitting red light, a green light source 10G emitting green light, and a blue light source 10B emitting blue light. The light sources 10R, 10G, and 10B are, for example, backlight-type light sources directly irradiating the liquid crystal light valve 30.

The liquid crystal light valve 30 modulates, in response to image information, the light emitted from the light emitting device 10. In the illustrated example, the projector 100 includes, as the liquid crystal light valve 30, a liquid crystal light valve 30R on which the red light is incident, a liquid crystal light valve 30G on which the green light is incident, and a liquid crystal light valve 30B on which the blue light is incident.

The cross dichroic prism 50 combines the lights emitted from the liquid crystal light valves 30R, 30G, and 30B and directs the combined light to the projection lens 60. The cross dichroic prism 50 is formed by bonding four right-angle prisms together, and on the inner surfaces thereof, a dielectric multilayer film that reflects the red light and a dielectric multilayer film that reflects the blue light are disposed in a cross shape. The three color lights are combined by these dielectric multilayer films to form light that represents a color image.

The projection lens 60 projects the light combined by the cross dichroic prism 50 onto a screen (not shown). The projection lens 60 can project an image formed by the liquid crystal light valves 30R, 30G, and 30B onto the screen in an enlarged manner.

Figure 2:
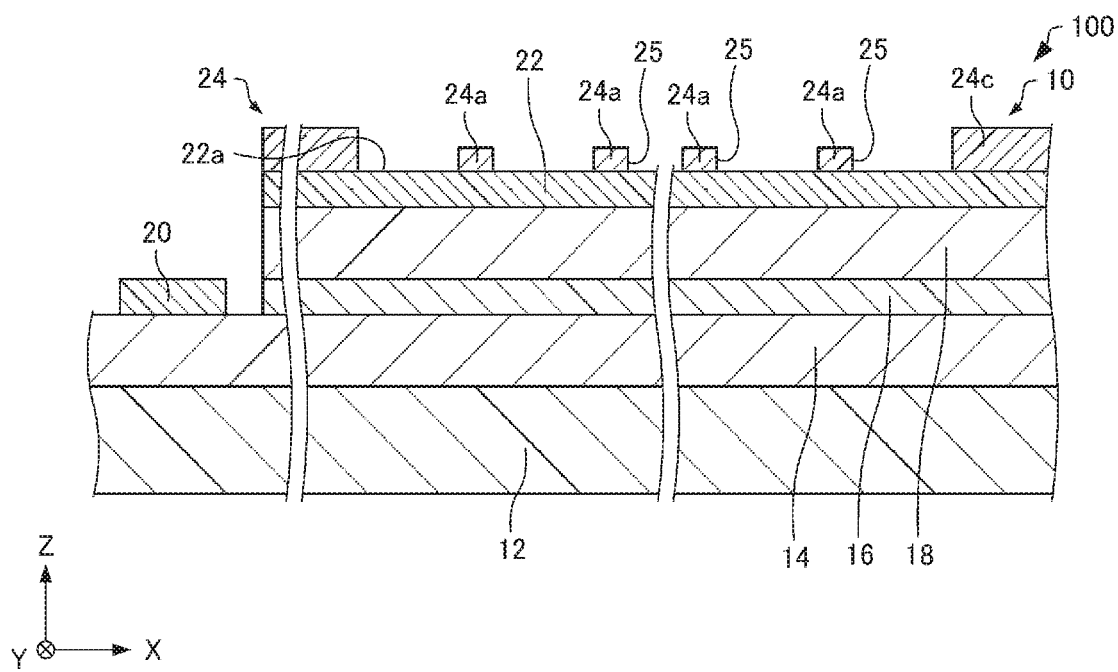
FIG. 2 is a cross-sectional view schematically showing a light emitting device of the projector according to the first embodiment.
Figure 3:
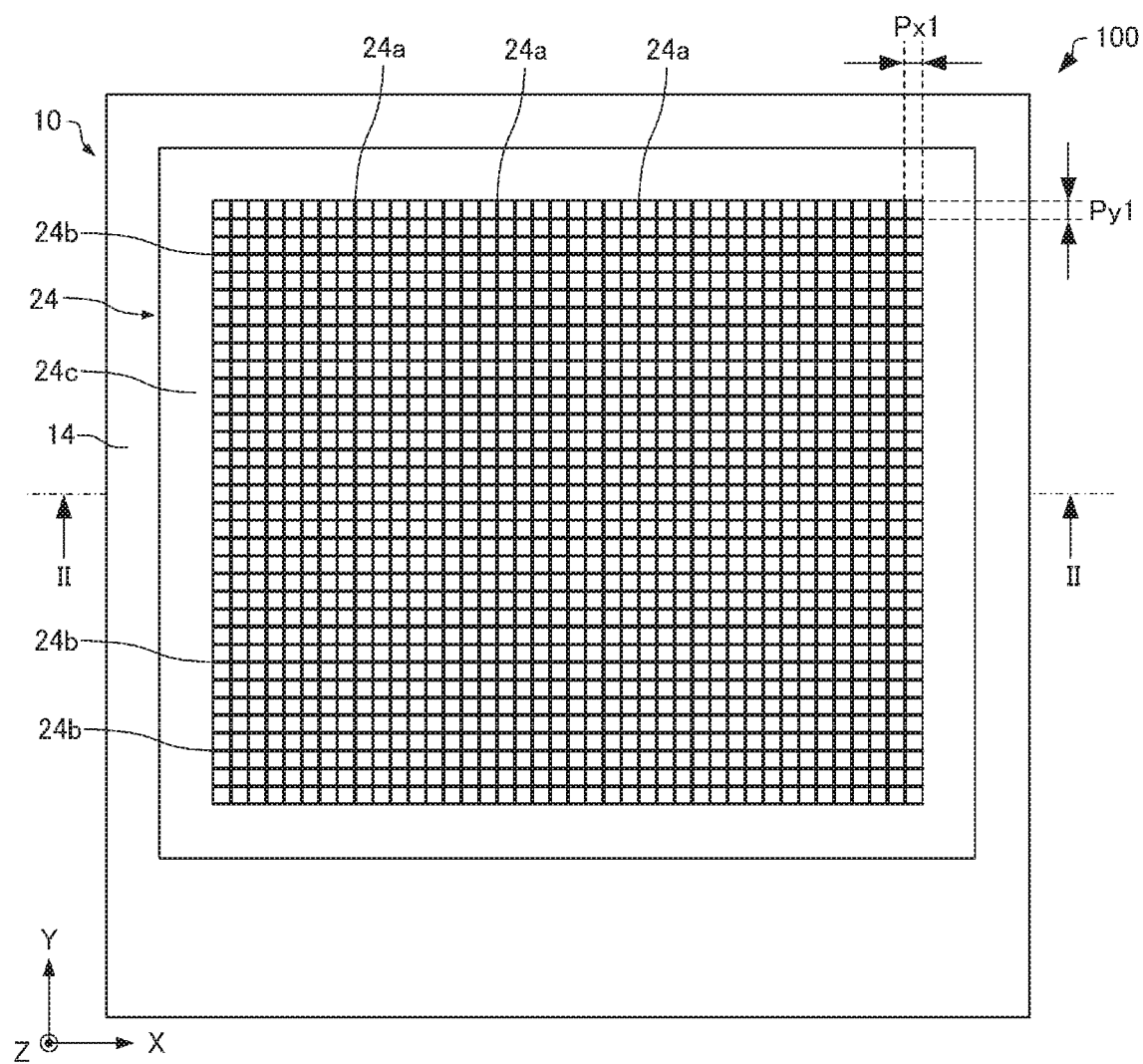
FIG. 3 is a plan view schematically showing the light emitting device of the projector according to the first embodiment.
Figure 4:
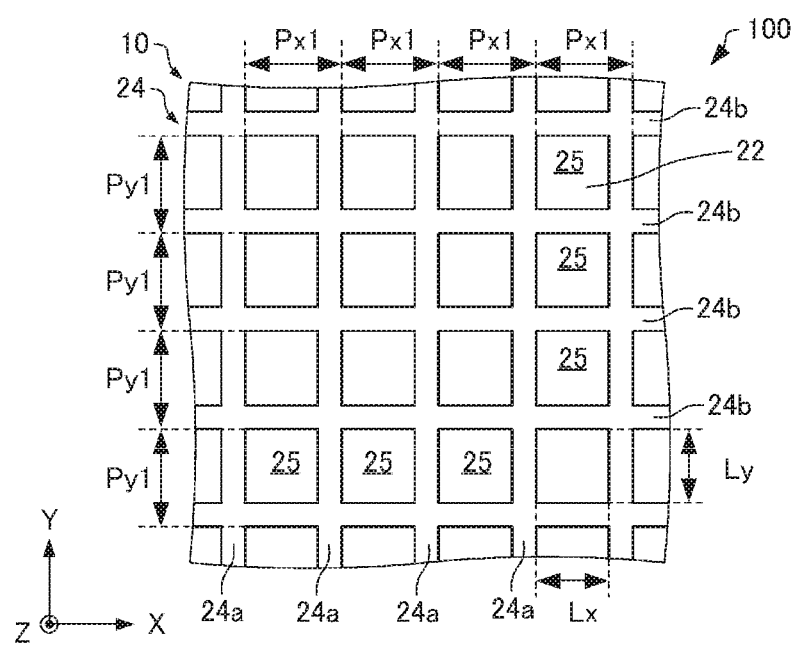
FIG. 4 is a plan view schematically showing the light emitting device of the projector according to the first embodiment.

FIG. 2 is a cross-sectional view schematically showing the light emitting device 10. FIG. 3 is a plan view schematically showing the light emitting device 10. FIG. 4 is an enlarged view of FIG. 3. FIG. 2 is a cross-sectional view taken along line II-II in FIG. 3. In FIGS. 2 to 4 and FIGS. 5 to 7 to be described later, the X-axis, the Y-axis, and the Z-axis are illustrated as three axes orthogonal to each other.

As shown in FIGS. 2 to 4, the light emitting device 10 includes, for example, a substrate 12, a first semiconductor layer 14, a light emitting layer 16, a second semiconductor layer 18, a first electrode 20, a second electrode 22, and a third electrode 24. The light emitting device 10 is, for example, a light emitting diode (LED). For convenience sake, the first electrode 20 is not illustrated in FIG. 3.

The substrate 12 is, for example, a sapphire substrate or the like.

The first semiconductor layer 14 is provided on the substrate 12. The first semiconductor layer 14 is provided between the substrate 12 and the light emitting layer 16. The first semiconductor layer 14 is, for example, an n-type GaN layer doped with Si.

In the present disclosure, the "top" is a direction away from the substrate 12, as viewed from the light emitting layer 16, in a stacking direction of the first semiconductor layer 14 and the light emitting layer 16, and the "bottom" is a direction toward the substrate 12, as viewed from the light emitting layer 16, in the stacking direction. In the illustrated example, the "top" is on the +Z-axis direction side, and the "bottom" is on the −Z-axis direction side.

The light emitting layer 16 is provided on the first semiconductor layer 14. The light emitting layer 16 is provided between the first semiconductor layer 14 and the second semiconductor layer 18. The light emitting layer 16 has, for example, a multi-quantum well (MQW) structure in which InGaN layers and GaN layers are alternately stacked. The light emitting layer 16 is a layer that can generate light by injection of a current.

The second semiconductor layer 18 is provided on the light emitting layer 16. The second semiconductor layer 18 is a layer of a conductivity type different from that of the first semiconductor layer 14. The second semiconductor layer 18 is, for example, a p-type GaN layer doped with Mg.

In the light emitting device 10, a pin diode is configured of the p-type second semiconductor layer 18, the light emitting layer 16 not doped with an impurity, and the n-type first semiconductor layer 14. The semiconductor layers 14 and 18 are layers having a band gap larger than that of the light emitting layer 16. In the light emitting device 10, when forward bias voltage of the pin diode is applied (when a current is injected) between the first electrode 20 and the second and third electrodes 22 and 24, recombination of electrons and holes occurs in the light emitting layer 16. This recombination causes light emission.

Light that is generated in the light emitting layer 16 and that travels to the +Z-axis direction side transmits through the second electrode 22 and is emitted. For example, by providing a mirror layer (not shown) below the substrate 12 or between the substrate 12 and the first semiconductor layer 14, light that is generated in the light emitting layer 16 and that travels to the −Z-axis direction side can be reflected and emitted from the second electrode 22 side.

The first electrode 20 is provided on the first semiconductor layer 14. The first electrode 20 is electrically connected to the first semiconductor layer 14. In the illustrated example, the first electrode 20 is in contact with the first semiconductor layer 14. The first electrode 20 may be in ohmic contact with the first semiconductor layer 14. As the first electrode 20, for example, an electrode obtained by stacking a Ti layer, an Al layer, and an Au layer in order, or an electrode obtained by stacking a Ni layer and an Au layer in order, from the first semiconductor layer 14 side is used. The first electrode 20 is one of electrodes for injecting a current into the light emitting layer 16.

The second electrode 22 is provided on the second semiconductor layer 18. The second electrode 22 is electrically connected to the second semiconductor layer 18. In the illustrated example, the second electrode 22 is in contact with the second semiconductor layer 18. The second electrode 22 may be in ohmic contact with the second semiconductor layer 18. The second electrode 22 has, for example, a layer-like shape. In a plan view as viewed in the stacking direction of the first semiconductor layer 14 and the light emitting layer 16 (hereinafter also referred to simply as "in a plan view"), the second electrode 22 overlaps, for example, the light emitting layer 16.

The second electrode 22 is transparent to the light generated in the light emitting layer 16. That is, the second electrode 22 is a transparent electrode that can transmit the light generated in the light emitting layer 16. The material of the second electrode 22 is, for example, ITO. The second electrode 22 includes an emission surface 22a to emit light. In the illustrated example, the emission surface 22a is a surface of the second electrode 22 on the +Z-axis direction side.

The third electrode 24 is provided on the second electrode 22. The third electrode 24 is connected to the second electrode 22. The third electrode 24 is in contact with the second electrode 22. The third electrode 24 is electrically connected to the second semiconductor layer 18 via the second electrode 22.

The third electrode 24 blocks the light generated in the light emitting layer 16. The transmittance of the third electrode 24 to the light generated in the light emitting layer 16 is lower than the transmittance of the second electrode 22 to the light generated in the light emitting layer 16. The resistivity of the third electrode 24 is lower than the resistivity of the second electrode 22. The material of the third electrode 24 is, for example, APC alloy, which is an alloy of Ag, Pd, and Cu, or is material obtained by stacking a Cr layer and an Au layer in order from the second electrode 22 side. The second electrode 22 and the third electrode 24 are the other electrode for injecting a current into the light emitting layer 16.

The third electrode 24 is provided with a plurality of openings 25. The opening 25 penetrates the third electrode 24. In the example shown in FIGS. 3 and 4, the shape of the opening 25 is a rectangle (square) in a plan view. The plurality of openings 25 are provided in a matrix in a plan view. The plurality of openings 25 are arranged at pitches Px1 in the X-axis direction and arranged at pitches Py1 in the Y-axis direction. In the illustrated example, the arrangement pitch Px1 and the arrangement pitch Py1 are the same pitch.

The third electrode 24 has, for example, a grid-like shape in a plan view. The third electrode 24 includes a plurality of first conductive sections 24a arranged at the arrangement pitches Px1 in a first direction (e.g., the X-axis direction), second conductive sections 24b arranged at the arrangement pitches Py1 in a second direction (e.g., the Y-axis direction) that crosses the first direction, and a frame-like frame section 24c connected to the first conductive sections 24a and the second conductive sections 24b.

The first conductive section 24a of the third electrode 24 extends in the Y-axis direction from a portion of the frame section 24c on the +Y-axis direction side to a portion thereof on the −Y-axis direction side. The first conductive section 24a has a shape having its longitudinal direction in the Y-axis direction. The second conductive section 24b extends in the X-axis direction from a portion of the frame section 24c on the +X-axis direction side to a portion thereof on the −X-axis direction side. The second conductive section 24b has a shape having its longitudinal direction in the X-axis direction. In the example shown in FIG. 2, the thickness of the frame section 24c is larger than the thickness of the conductive sections 24a and 24b.

In a manufacturing method of the light emitting device 10, for example, the first semiconductor layer 14, the light emitting layer 16, and the second semiconductor layer 18 are epitaxially grown in this order on the substrate 12. Examples of epitaxial growth include, for example, a metal-organic chemical vapor deposition (MOCVD) method and a molecular beam epitaxy (MBE) method. Next, for example, the electrodes 20, 22, and 24 are formed by a vacuum evaporation method or the like.

Figure 5:
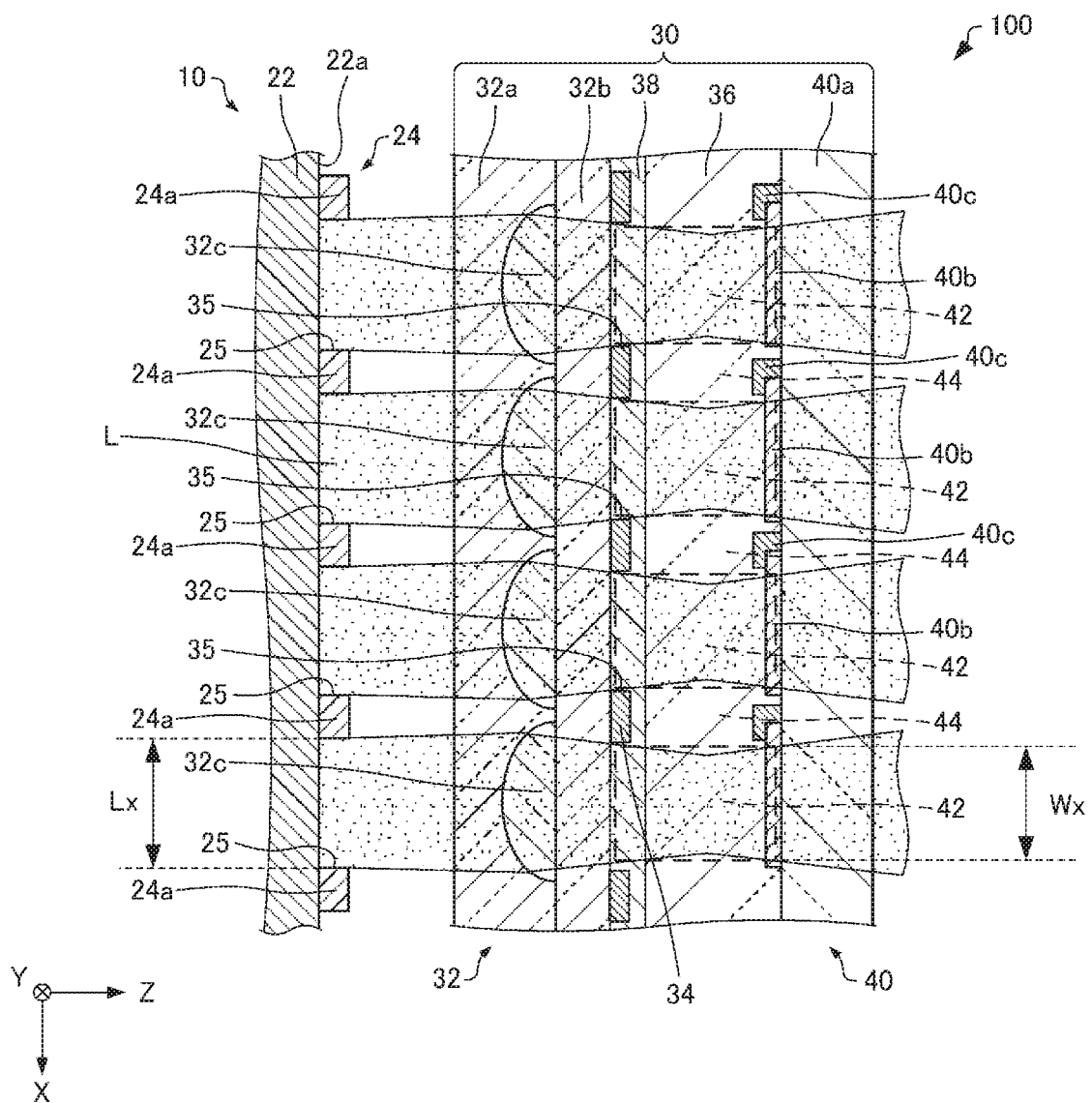
FIG. 5 is a cross-sectional view schematically showing the light emitting device and a light modulator of the projector according to the first embodiment.
Figure 6:
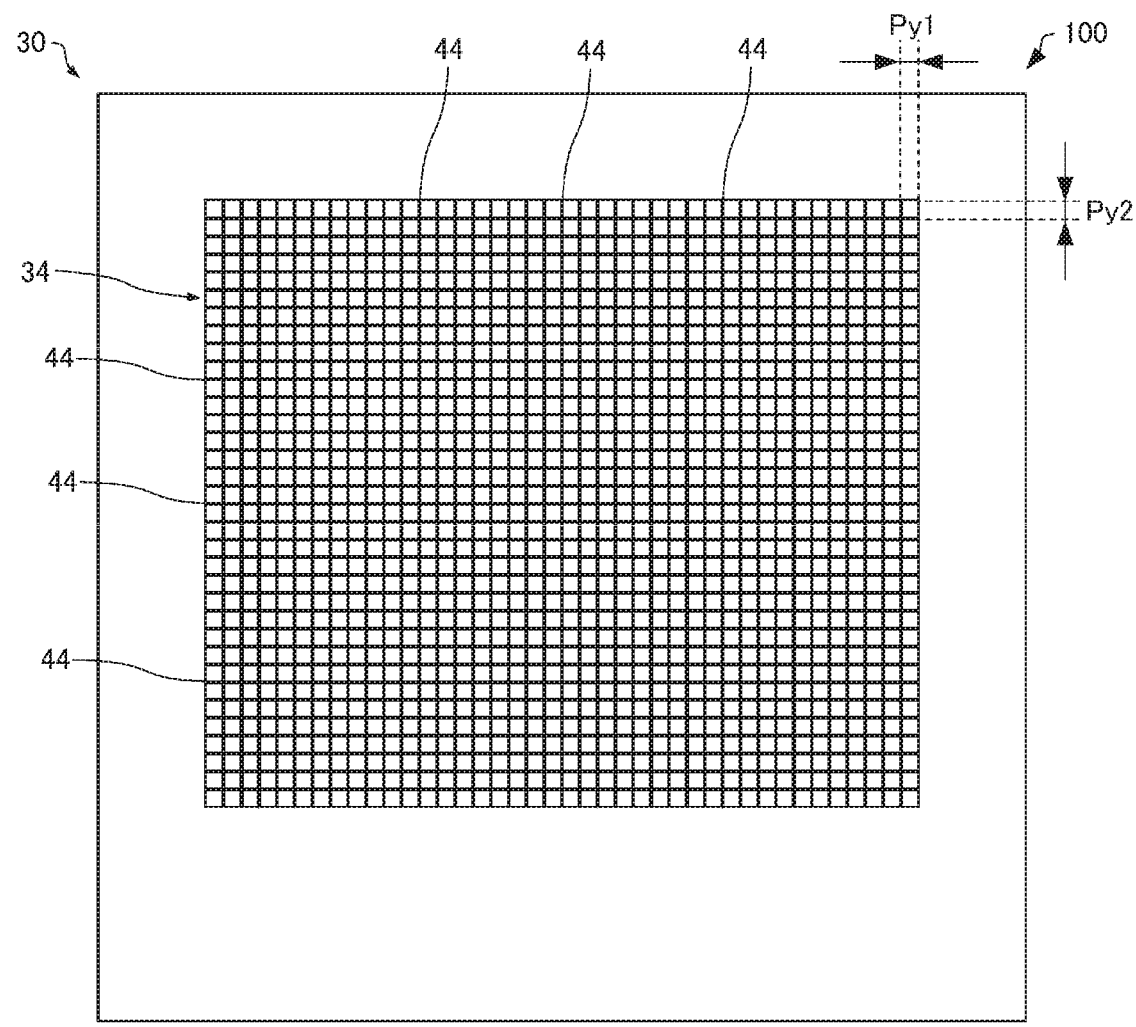
FIG. 6 is a plan view schematically showing the light modulator of the projector according to the first embodiment.
Figure 7:
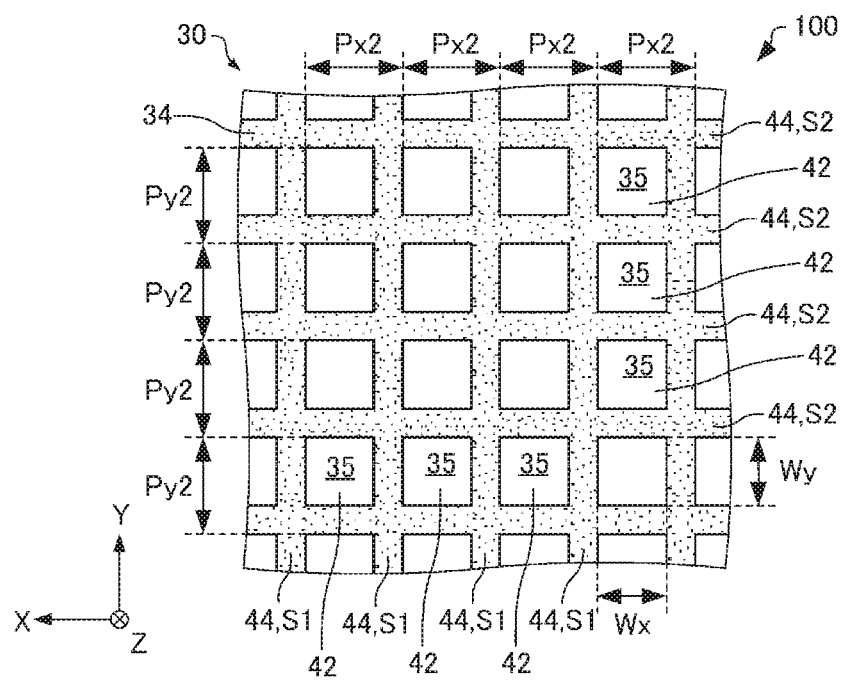
FIG. 7 is a plan view schematically showing the light modulator of the projector according to the first embodiment.

FIG. 5 is a cross-sectional view schematically showing the light emitting device 10 and the liquid crystal light valve 30. FIG. 6 is a plan view schematically showing the liquid crystal light valve 30. FIG. 7 is an enlarged view of FIG. 6. FIG. 5 is a cross-sectional view corresponding to a cross section taken along line II-II in FIG. 3. Moreover, in FIG. 5, four pixels 42 and the light emitting device 10 corresponding thereto are illustrated.

As shown in FIG. 5, the liquid crystal light valve 30 includes, for example, a counter substrate 32, a black matrix 34, a liquid crystal layer 36, a common electrode 38, and a thin film transistor (TFT) substrate 40. For convenience sake, the counter substrate 32 is not illustrated in FIGS. 6 and 7.

As shown in FIG. 5, the counter substrate 32 is provided facing the emission surface 22a of the light emitting device 10. The counter substrate 32 includes transparent substrates 32a and 32b and condensing lenses 32c.

The transparent substrates 32a and 32b support the condensing lenses 32c. The transparent substrates 32a and 32b are transparent to light L emitted from the light emitting device 10. The transparent substrates 32a and 32b transmit the light L. The transparent substrates 32a and 32b are, for example, quartz substrates.

The condensing lens 32c is, for example, provided interposed between the transparent substrates 32a and 32b. The condensing lens 32c directs the light L to the pixel 42. The condensing lens 32c condenses the light L. A plurality of the condensing lenses 32c are provided. The plurality of condensing lenses 32c constitute, for example, a microlens array (MLA). The condensing lens 32c is provided corresponding to the opening 25. That is, the light L passing through one opening 25 is incident on one condensing lens 32c.

The black matrix 34 is a light shielding mask that blocks the light L so that TFTs 40c of the TFT substrate 40 are not irradiated with the light L. When the TFT 40c is irradiated with the light L, the TFT 40c may malfunction. The black matrix 34 can prevent the malfunction of the TFT 40c.

The material of the liquid crystal layer 36 is, for example, oily transparent liquid crystal material. The TFT substrate 40 includes a transparent substrate 40a, pixel electrodes 40b, and the TFTs 40c. The transparent substrate 40a supports the pixel electrodes 40b and the TFTs 40c.

The liquid crystal layer 36 is interposed between the common electrode 38 and the pixel electrodes 40b. The transmittance of the liquid crystal layer 36 to the light L changes with voltage applied between the common electrode 38 and the pixel electrode 40b. The common electrode 38 is an electrode common to a plurality of the pixels 42. One pixel electrode 40b is provided in one pixel 42.

The TFT 40c changes the voltage between the electrodes 38 and 40b in response to input image information, and modulates the light L passing through the liquid crystal layer 36. With this configuration, brightness can be changed for each of the pixels 42, and an image can be formed. The TFT 40c is a thin film transistor. The common electrode 38, the pixel electrode 40b, and the transparent substrate 40a are transparent to the light L. The common electrode 38, the pixel electrode 40b, and the transparent substrate 40a transmit the light L. The transparent substrate 40a is, for example, a glass substrate. Although not illustrated, the liquid crystal light valve 30 may include a polarizer to align a polarization direction of the light L.

As shown in FIGS. 5 to 7, the liquid crystal light valve 30 includes the plurality of pixels 42 and a gap region 44 between the pixels 42 adjacent to each other.

The pixel 42 is configured of, for example, portions of the common electrode 38, the liquid crystal layer 36, and the pixel electrode 40b that overlap an opening 35 of the black matrix 34 as viewed in the Z-axis direction. The opening 35 penetrates the black matrix 34.

As shown in FIGS. 6 and 7, the shape of the pixel 42 is, for example, a rectangle (e.g., a square) in a plan view. The plurality of pixels 42 are provided. The pixel 42 is, for example, provided corresponding to the opening 25. That is, the light L passing through one opening 25 is incident on one pixel 42.

The plurality of pixels 42 are provided in a matrix in a plan view. The plurality of pixels 42 are arranged at pitches Px2 in the X-axis direction and arranged at pitches Py2 in the Y-axis direction. In the illustrated example, the arrangement pitch Px2 and the arrangement pitch Py2 are the same pitch.

A plurality of the gap regions 44 are provided. The gap region 44 is configured of, for example, the black matrix 34, portions of the common electrode 38, the liquid crystal layer 36, and the pixel electrode 40b that do not overlap the opening 35 of the black matrix 34 as viewed in the Z-axis direction, and the TFT 40c. The plurality of gap regions 44 are arranged at the arrangement pitches Px2 in the X-axis direction and arranged at the arrangement pitches Py2 in the Y-axis direction. A shadow (shadow generated by the light L) S1 of the first conductive section 24a and a shadow (shadow generated by the light L) S2 of the second conductive section 24b are cast on the gap regions 44.

The arrangement pitch Px1 of the plurality of first conductive sections 24a in the X-axis direction is an integer multiple (positive integer multiple) of the arrangement pitch Px2 of the plurality of gap regions 44 in the X-axis direction. The arrangement pitch Py1 of the plurality of second conductive sections 24b in the Y-axis direction is an integer multiple of the arrangement pitch Py2 of the plurality of gap regions 44 in the Y-axis direction. In the illustrated example, the arrangement pitch Px1 is the same as the arrangement pitch Px2, and the arrangement pitch Py1 is the same as the arrangement pitch Py2. The arrangement pitch Px1 is, for example, substantially 10 µm.

In a plan view, a distance (size of the opening 25 in the X-axis direction) Lx between the first conductive sections 24a adjacent to each other is, for example, larger than a size Wx of the pixel 42 in the X-axis direction. A distance (size of the opening 25 in the Y-axis direction) Ly between the second conductive sections 24b adjacent to each other is, for example, larger than a size Wy of the pixel 42 in the Y-axis direction.

The projector 100 has, for example, the following features.

The projector 100 includes the third electrode 24 connected to the second electrode 22. The resistivity of the third electrode 24 is lower than the resistivity of the second electrode 22. The arrangement pitch Px1 of the plurality of first conductive sections 24a in the X-axis direction is an integer multiple of the arrangement pitch Px2 of the plurality of gap regions 44 in the X-axis direction. The shadow S1 of the first conductive section 24a generated by the light L emitted from the light emitting device 10 is cast on the gap region 44. Therefore, in the projector 100, the resistance of an electrode (electrode composed of the second electrode 22 and the third electrode 24) electrically connected to the second semiconductor layer 18 can be reduced, and the shadow S1 of the first conductive section 24a does not appear on an illumination object such as a screen. Further, in the projector 100, the resistance of the electrode electrically connected to the second semiconductor layer 18 can be reduced; therefore, for example, desired current can be injected with good uniformity into the entire region of the light emitting layer 16, and light can be emitted with good uniformity in the light emitting layer 16. Hence, the screen can be illuminated with good uniformity.

In the projector 100, the third electrode 24 includes the plurality of second conductive sections 24b arranged in the Y-axis direction. The arrangement pitch Py1 of the plurality of second conductive sections 24b in the Y-axis direction is an integer multiple of the arrangement pitch Py2 of the plurality of gap regions 44 in the Y-axis direction. The shadow S2 of the second conductive section 24b generated by the light L emitted from the light emitting device 10 is cast on the gap region 44. Therefore, in the projector 100, the shadow S2 of the second conductive section 24b does not appear on the screen.

In the projector 100, the arrangement pitch Px1 of the plurality of first conductive sections 24a in the X-axis direction is the same as the arrangement pitch Px2 of the plurality of gap regions 44 in the X-axis direction. Therefore, in the projector 100, the density of the first conductive section 24a can be increased compared to, for example, when the arrangement pitch Px1 is twice or more the arrangement pitch Px2. Hence, in the projector 100, the resistance of the electrode electrically connected to the second semiconductor layer 18 can be further reduced.

In the projector 100, the liquid crystal light valve 30 includes the condensing lens 32c directing the light L emitted from the light emitting device 10 to the pixel 42. The distance Lx between the first conductive sections 24a adjacent to each other is larger than the size Wx of the pixel 42 in the X-axis direction. Therefore, in the projector 100, for example, the amount of the light L blocked at the first conductive section 24a can be reduced while reducing the amount of the light L blocked by the black matrix 34. Hence, the projector 100 can efficiently illuminate the screen.

Although the GaN-based light emitting device 10 emitting blue light has been described in the above, a light emitting device can emit green light or red light by using, for example, a GaP-based or GaAs-based semiconductor layer.

Although the light emitting device 10 has been described as being an LED in the above, a light emitting device according to the present disclosure may be a vertical cavity surface emitting laser (VCSEL), a nanocolumn light emitting element (a nanocolumn LED or a nanocolumn laser diode (LD)), or the like. The nanocolumn light emitting element is a light emitting element having nano-sized columnar (column-shaped) crystal bodies of GaN or the like. In the nanocolumn light emitting element, for example, the columnar crystal body includes a first semiconductor layer, a light emitting layer, and a second semiconductor layer, and the second semiconductor layers are spaced from each other in the columnar crystal bodies that are adjacent to each other. Therefore, it is especially preferable to provide a third electrode.

Although the liquid crystal light valve is used as a light modulator in the above, a projector according to the present disclosure may be a digital light processing (DLP) (registered trademark) projector using a digital micro-mirror device (DMD) (registered trademark) as a light modulator.

1.2. Modified Examples of Projector 1.2.1. First Modified Example

Figure 8:
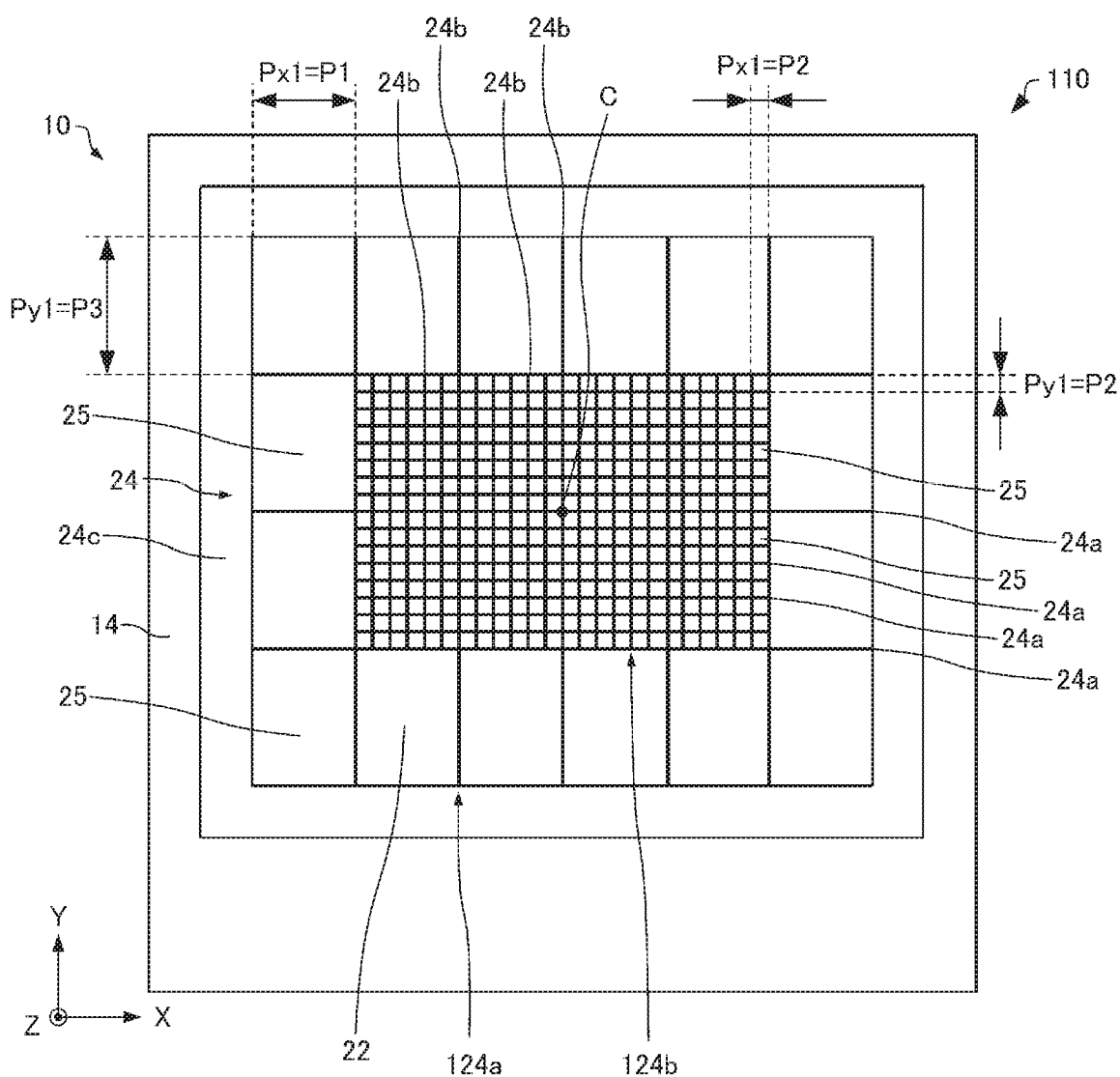
FIG. 8 is a plan view schematically showing a light emitting device of a projector according to a first modified example of the first embodiment.

Next, a projector according to a first modified example of the first embodiment will be described with reference to the drawings. FIG. 8 is a plan view schematically showing the light emitting device 10 of the projector 110 according to the first modified example of the first embodiment. In FIG. 8 and FIGS. 9 to 12 to be described later, the X-axis, the Y-axis, and the Z-axis are illustrated as three axes orthogonal to each other.

Hereinafter, differences of the projector 110 according to the first modified example of the first embodiment from the example of the projector 100 according to the first embodiment described above will be described, but similarities will not be described. The same applies to projectors according to later-described second, third, and fourth modified examples of the first embodiment.

In the projector 100 described above, as shown in FIG. 3, all of the arrangement pitches Px1 of the plurality of first conductive sections 24a in the X-axis direction are the same pitch. In contrast to this, in the projector 110 as shown in FIG. 8, the third electrode 24 includes a first portion 124a in which the arrangement pitch Px1 of the plurality of first conductive sections 24a in the X-axis direction is a first pitch P1, and a second portion 124b in which the arrangement pitch Px1 is a second pitch P2 smaller than the first pitch P1.

In the first portion 124a of the third electrode 24, the first pitch P1 is an arrangement pitch that is two or more integer times the arrangement pitch Px2 of the plurality of gap regions 44 in the X-axis direction. In the illustrated example, the first pitch P1 is an arrangement pitch that is six times the arrangement pitch Px2. In the first portion 124a, the arrangement pitch Py1 of the plurality of second conductive sections 24b in the Y-axis direction is a third pitch P3. In the illustrated example, the third pitch P3 is an arrangement pitch that is eight times the arrangement pitch Py2 of the plurality of gap regions 44 in the Y-axis direction.

Although the arrangement pitch Px1 of the first conductive section 24a is different from the arrangement pitch Py1 of the second conductive section 24b in the first portion 124a in the illustrated example, the arrangement pitch Px1 may be the same as the arrangement pitch Py1.

In the second portion 124b of the third electrode 24, the second pitch P2 is, for example, the same as the arrangement pitch Px2 of the plurality of gap regions 44 in the X-axis direction. In the second portion 124b, the arrangement pitch Py1 of the plurality of second conductive sections 24b in the Y-axis direction is smaller than the third pitch P3. In the illustrated example, the arrangement pitch Py1 is the second pitch P2 in the second portion 124b.

In a plan view, a distance between the second portion 124b and a center C of the second electrode 22 is smaller than a distance between the first portion 124a and the center C of the second electrode 22. In the illustrated example, the second portion 124b overlaps the center C. The first portion 124a surrounds the second portion 124b.

In the projector 110, the third electrode 24 includes the first portion 124a in which the arrangement pitch Px1 of the plurality of first conductive sections 24a in the X-axis direction is the first pitch P1, and the second portion 124b in which the arrangement pitch Px1 of the plurality of first conductive sections 24a in the X-axis direction is the second pitch P2 smaller than the first pitch P1. In a plan view, the distance between the second portion 124b and the center C of the second electrode 22 is smaller than the distance between the first portion 124a and the center C of the second electrode 22. Therefore, in the projector 110, a current injected by the third electrode 24 into the light emitting layer 16 can be increased at the central portion of the second electrode 22 where a current is reduced due to the resistance of the second electrode 22. Hence, in the projector 110, a current can be injected with good uniformity into the light emitting layer 16 in a plan view.

1.2.2. Second Modified Example

Figure 9:
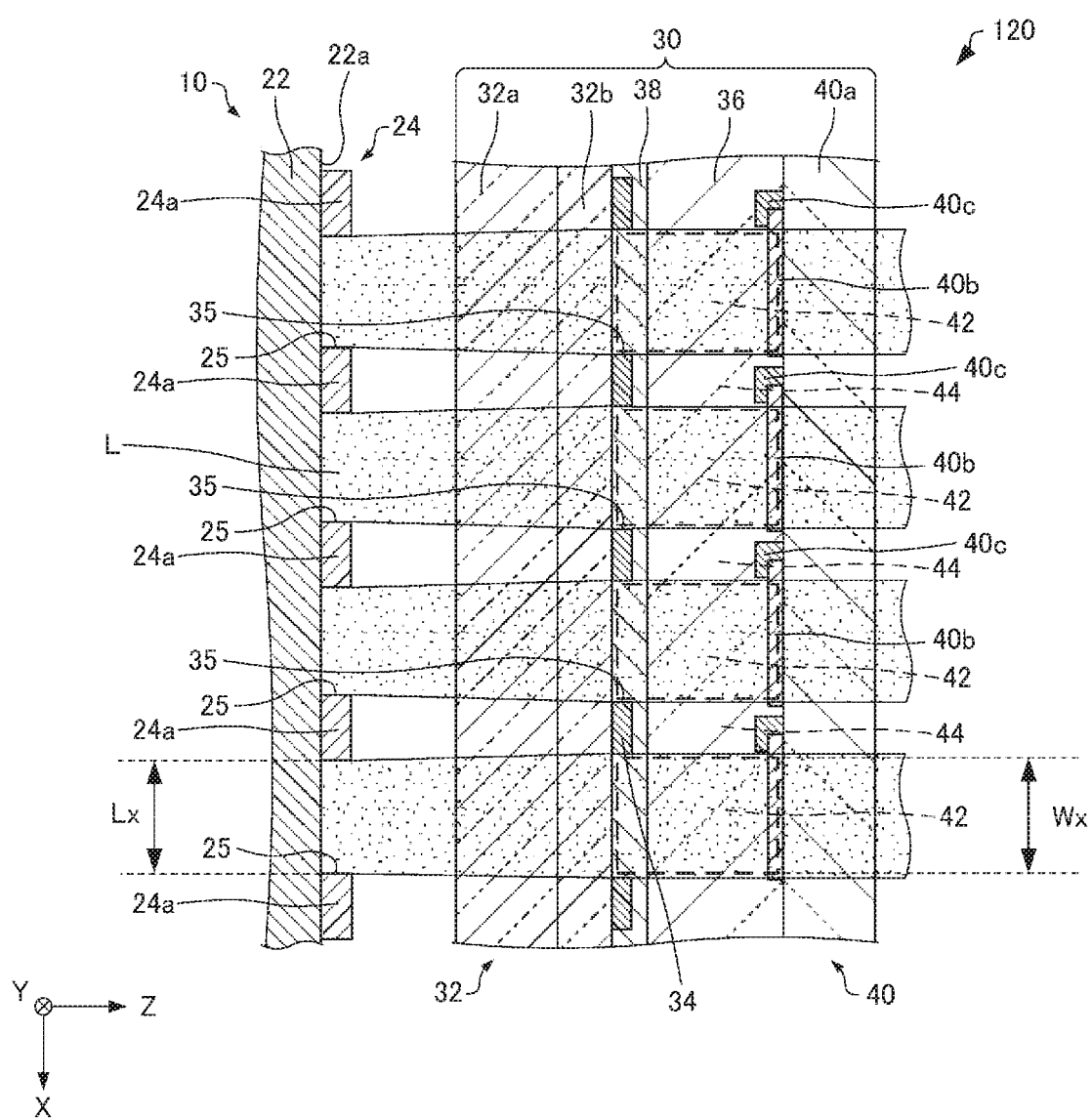
FIG. 9 is a cross-sectional view schematically showing a light emitting device and a light modulator of a projector according to a second modified example of the first embodiment.

Next, a projector according to a second modified example of the first embodiment will be described with reference to the drawings. FIG. 9 is a diagram schematically showing the projector 120 according to the second modified example of the first embodiment.

In the projector 100 described above, as shown in FIG. 5, the liquid crystal light valve 30 includes the condensing lens 32c. In contrast to this, in the projector 120 as shown in FIG. 9, the liquid crystal light valve 30 does not include the condensing lens 32c.

In the projector 120, the distance Lx between the first conductive sections 24a adjacent to each other is smaller than the size Wx of the gap region 44 in the X-axis direction. Similarly, the distance Ly between the second conductive sections 24b adjacent to each other is smaller than the size Wy of the gap region 44 in the Y-axis direction.

Figure 10:
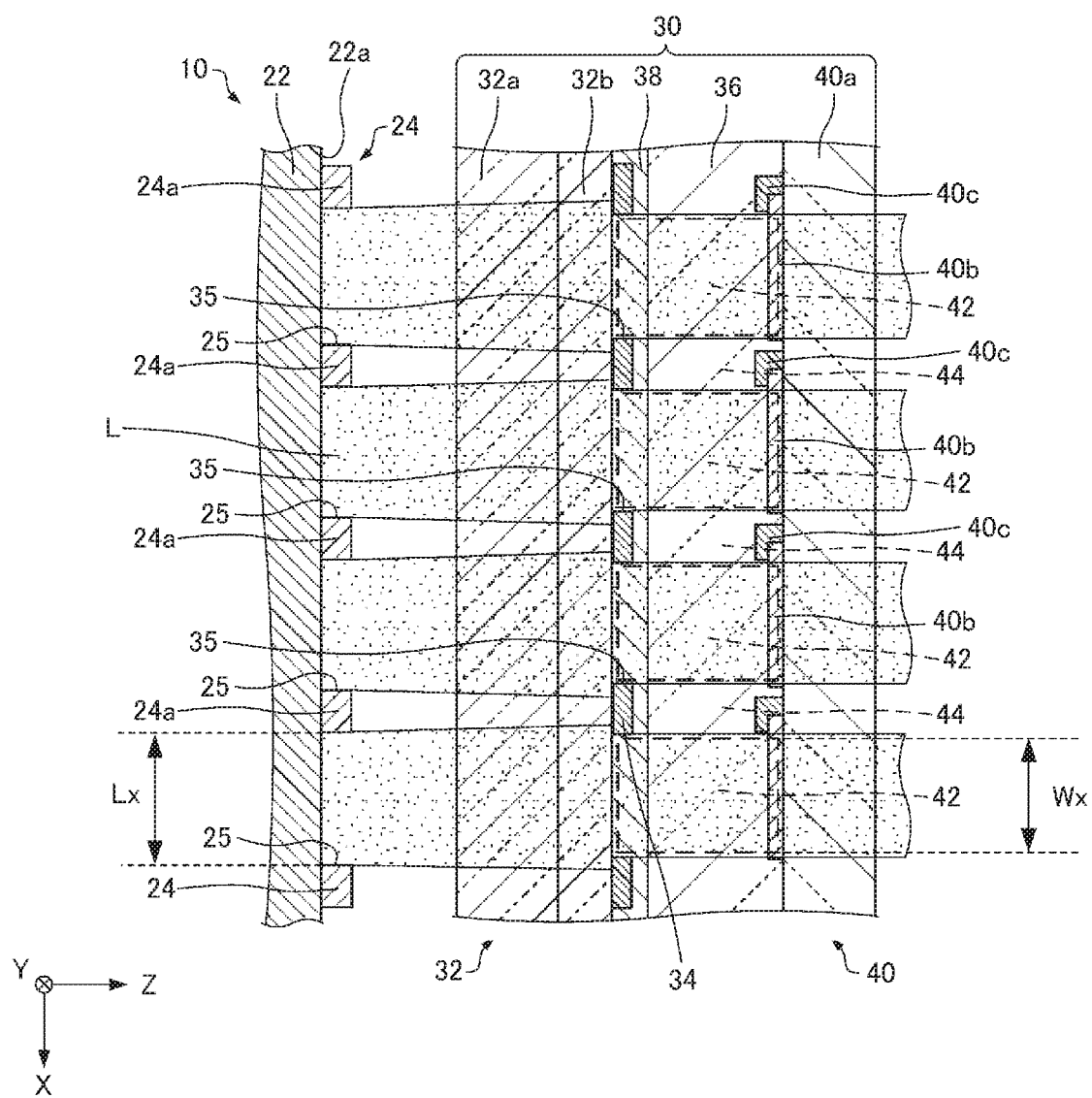
FIG. 10 is a cross-sectional view schematically showing a light emitting device and a light modulator of a projector according to a reference example.

In the projector 120, the distance Lx between the first conductive sections 24a adjacent to each other is smaller than the size Wx of the gap region 44 in the X-axis direction, and therefore, for example, the amount of the light L blocked by the black matrix 34 can be reduced. Therefore, in the projector 120, the screen can be efficiently illuminated. Further, a rise in temperature of the liquid crystal light valve 30 can be suppressed. The light L diverges, and therefore, when, for example, the distance Lx is equal to or larger than the size Wx as shown in FIG. 10, the amount of the light L blocked by the black matrix 34 is increased.

1.2.3. Third Modified Example

Figure 11:
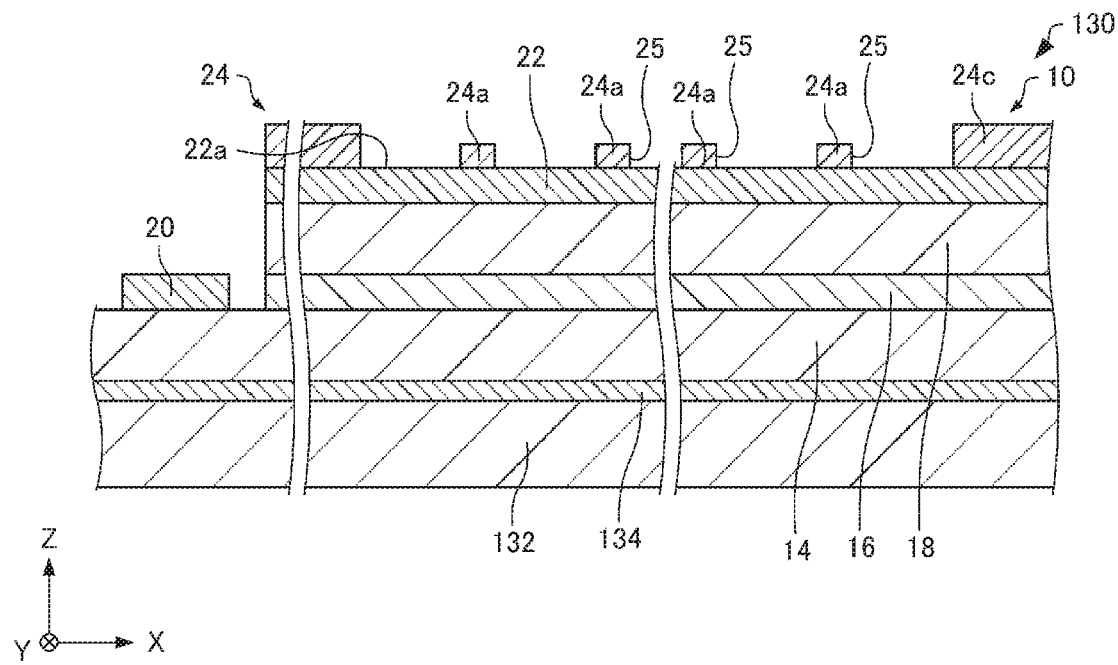
FIG. 11 is a cross-sectional view schematically showing a light emitting device of a projector according to a third modified example of the first embodiment.

Next, a projector according to a third modified example of the first embodiment will be described with reference to the drawings. FIG. 11 is a cross-sectional view schematically showing the light emitting device 10 of the projector 130 according to the third modified example of the first embodiment.

In the projector 100 described above, the first semiconductor layer 14 is an n-type semiconductor layer, and the second semiconductor layer 18 is a p-type semiconductor layer. In contrast to this, in the projector 130, the first semiconductor layer 14 is a p-type semiconductor layer, and the second semiconductor layer 18 is an n-type semiconductor layer. The second electrode 22 is provided on the n-type second semiconductor layer 18.

In the projector 130, the light emitting device 10 includes a substrate 132 as shown in FIG. 11. The substrate 132 is, for example, a silicon substrate or the like. The substrate 132 can dissipate, for example, heat generated in the light emitting layer 16. A bonding layer 134 is provided between the substrate 132 and the first semiconductor layer 14. The bonding layer 134 is a layer for bonding the first semiconductor layer 14 to the substrate 132. The material of the bonding layer 134 is not particularly limited as long as the first semiconductor layer 14 can be bonded to the substrate 132.

In a manufacturing method of the light emitting device 10 of the projector 130, the second semiconductor layer 18, the light emitting layer 16, and the first semiconductor layer 14 are epitaxially grown in this order on the substrate 12, and thereafter, the substrate 12 is removed. Next, the first semiconductor layer 14 is bonded to the substrate 132 with the bonding layer 134. Next, the electrodes 20, 22, and 24 are formed.

In the projector 130, the first semiconductor layer 14 is a p-type semiconductor layer, the second semiconductor layer 18 is an n-type semiconductor layer, and the second electrode 22 is provided on the n-type second semiconductor layer 18. The resistance of an n-type semiconductor layer is, for example, lower than that of a p-type semiconductor layer. Therefore, in the projector 130, even when the second electrode 22 is a transparent electrode having a high resistance, a current can be injected with good uniformity into the light emitting layer 16.

1.2.4. Fourth Modified Example

Figure 12:
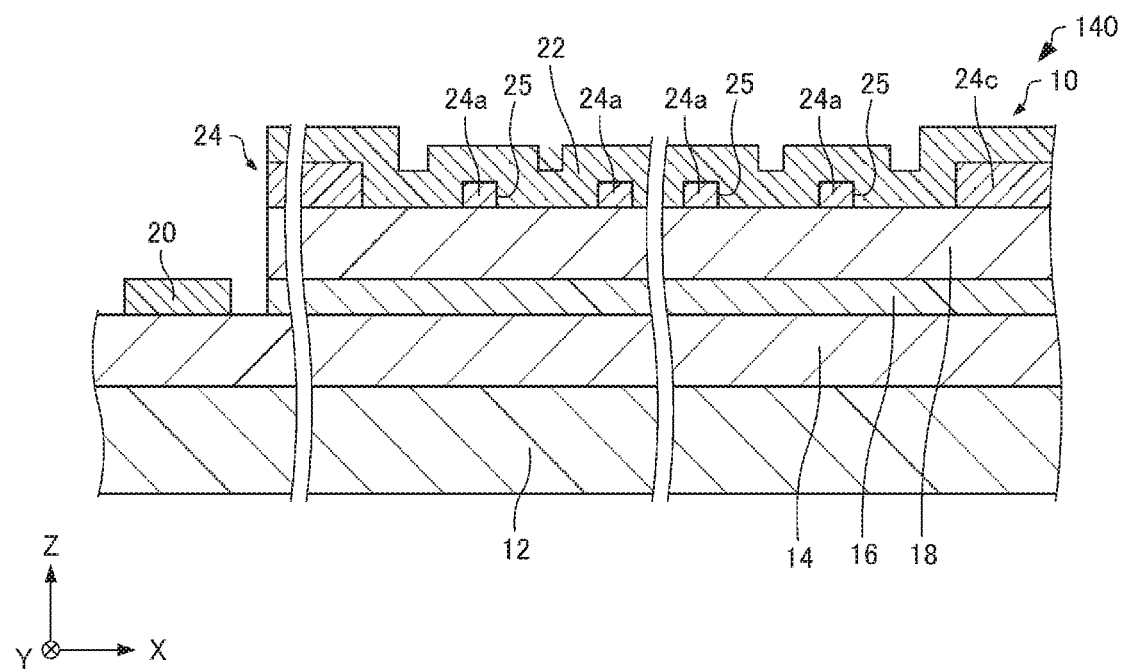
FIG. 12 is a cross-sectional view schematically showing a light emitting device of a projector according to a fourth modified example of the first embodiment.

Next, a projector according to a fourth modified example of the first embodiment will be described with reference to the drawings. FIG. 12 is a cross-sectional view schematically showing the light emitting device 10 of the projector 140 according to the fourth modified example of the first embodiment.

In the projector 100 described above, as shown in FIG. 2, the third electrode 24 is provided on the second electrode 22. In contrast to this, in the projector 140 as shown in FIG. 12, the third electrode 24 is provided between the second semiconductor layer 18 and the second electrode 22.

2. Second Embodiment

Figure 13:
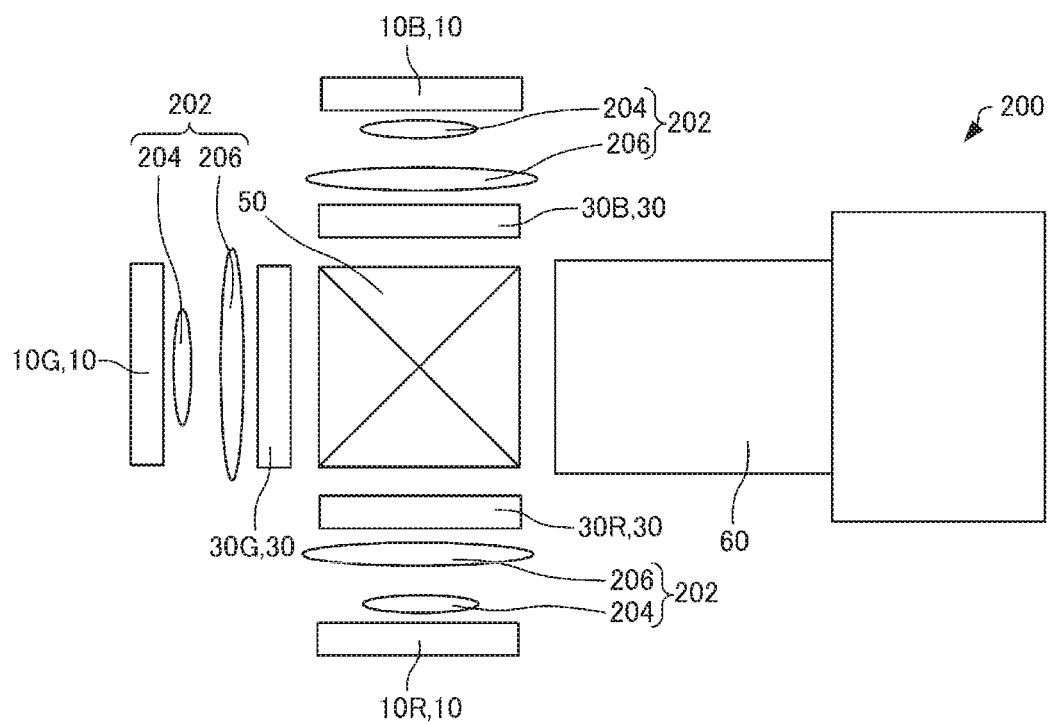
FIG. 13 is a diagram schematically showing a projector according to a second embodiment.
Figure 14:
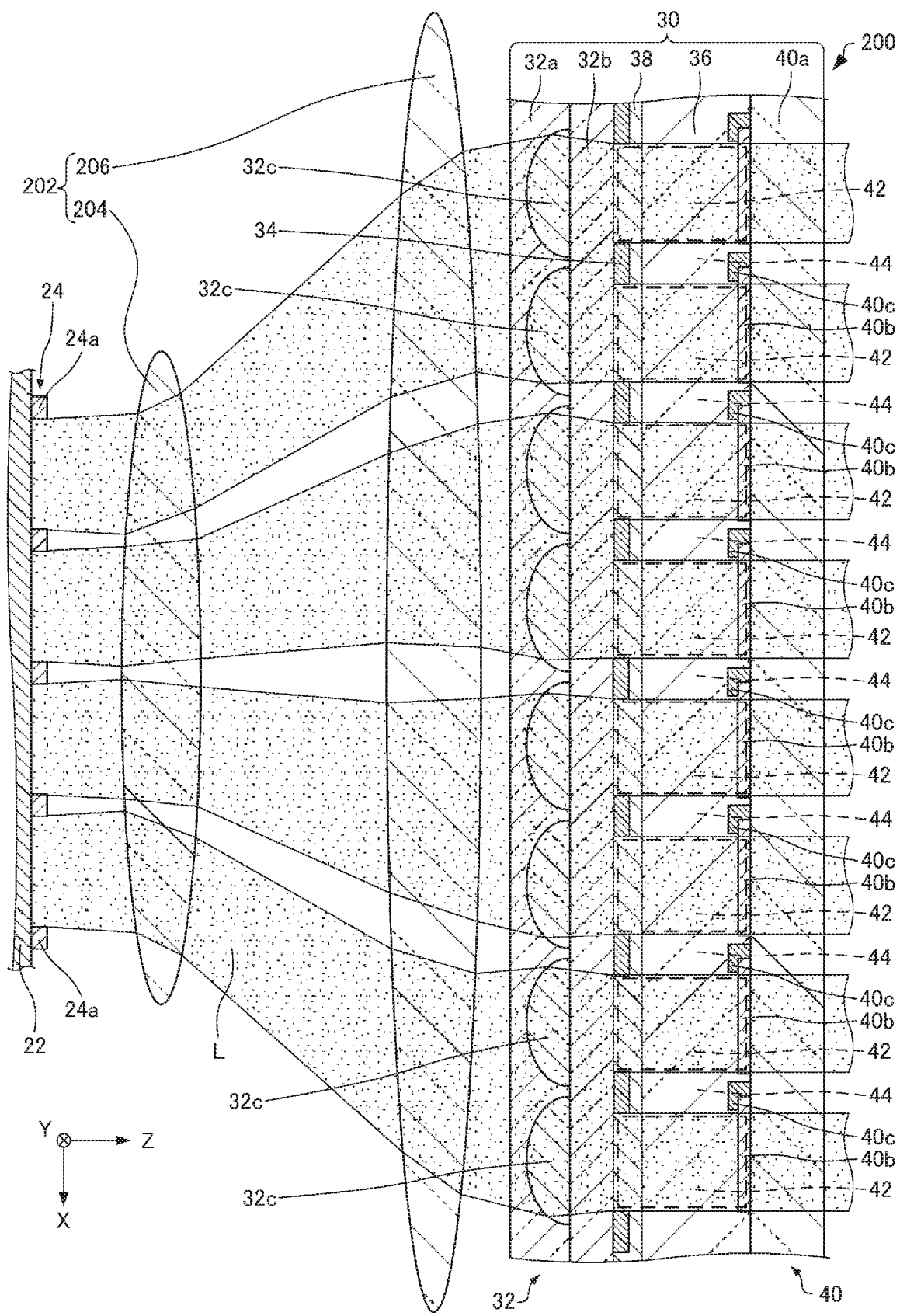
FIG. 14 is a cross-sectional view schematically showing a light emitting device and a light modulator of the projector according to the second embodiment.
Figure 15:
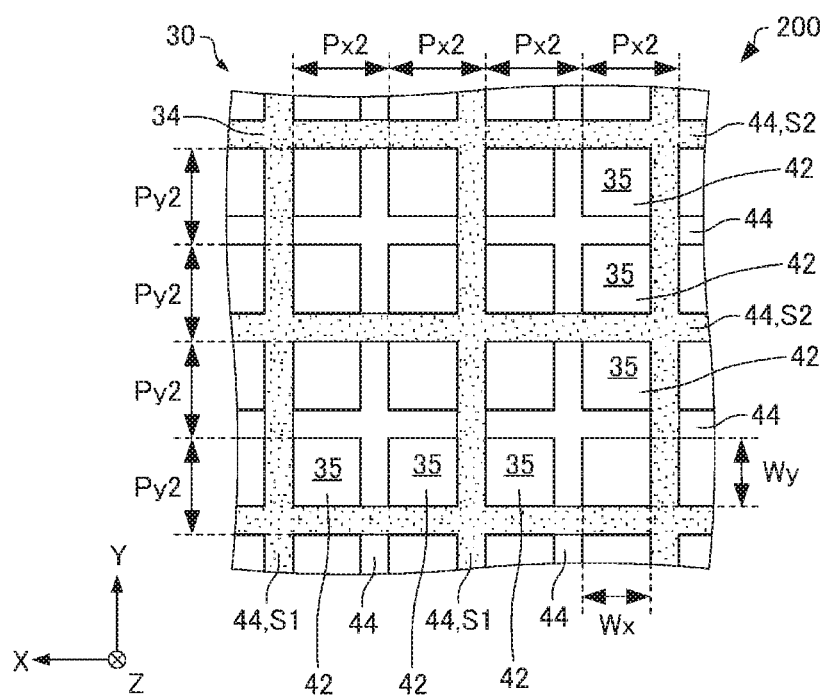
FIG. 15 is a plan view schematically showing the light modulator of the projector according to the second embodiment.

Next, a projector according to a second embodiment will be described with reference to the drawings. FIG. 13 is a diagram schematically showing the projector 200 according to the second embodiment. FIG. 14 is a cross-sectional view schematically showing the light emitting device 10 and the liquid crystal light valve 30 of the projector 200 according to the second embodiment. FIG. 15 is a plan view schematically showing the liquid crystal light valve 30 of the projector 200 according to the second embodiment.

For convenience sake, the light emitting device 10 and the liquid crystal light valve 30 are illustrated in a simplified manner in FIG. 13. Moreover, in FIG. 15, eight pixels 42 and the light emitting device 10 corresponding thereto are illustrated. In FIGS. 14 and 15, the X-axis, the Y-axis, and the Z-axis are illustrated as three axes orthogonal to each other.

As shown in FIGS. 13 and 14, the projector 200 differs from the projector 100 described above in that the projector 200 includes a lens system 202 directing the light L to the liquid crystal light valve 30.

The lens system 202 includes a first lens 204 and a second lens 206. The light L passes through the first lens 204 and then passes through the second lens 206. For example, the lens system 202 enlarges the light L incident thereon.

The arrangement pitch Px1 of the plurality of first conductive sections 24a in the X-axis direction is an integer multiple of a value obtained by multiplying the arrangement pitch Px2 of the plurality of gap regions 44 in the X-axis direction by the magnification of the lens system 202. Similarly, the arrangement pitch Py1 of the plurality of second conductive sections 24b in the Y-axis direction is an integer multiple of a value obtained by multiplying the arrangement pitch Py2 of the plurality of gap regions 44 in the Y-axis direction by the magnification of the lens system 202. The shadow S1 of the first conductive section 24a and the shadow S2 of the second conductive section 24b are cast on the black matrix 34 of the liquid crystal light valve 30 as shown in FIG. 15. With this configuration, the shadows S1 and S2 do not appear on the screen in the projector 200.

The projector 200 includes the lens system 202 directing the light L emitted from the light emitting device 10 to the liquid crystal light valve 30. Therefore, in the projector 200, the area of the light emitting device 10 in a plan view can be reduced compared to, for example, that in the projector 100. Hence, in the projector 200, miniaturization of the light emitting device 10 can be achieved.

In the present disclosure, a part of the configurations may be omitted within a scope in which the features or advantageous effects described in the present application are retained, or the embodiments and the modified examples may be combined together.

The present disclosure includes a configuration (e.g., a configuration having the same function, method, and result, or a configuration having the same advantage and advantageous effect) that is substantially the same as the configuration described in the embodiments. Moreover, the present disclosure includes a configuration in which a non-essential portion of the configurations described in the embodiments is replaced. Moreover, the present disclosure includes a configuration providing the same operational effect as that of the configuration described in the embodiments, or a configuration that can achieve the same advantage. Moreover, the present disclosure includes a configuration in which a publicly known technique is added to the configuration described in the embodiments.

What is claimed is:

1. A projector comprising:
a light emitting device; and
a light modulator modulating, in response to image information, light emitted from the light emitting device, wherein
the light emitting device includes
a first semiconductor layer,
a second semiconductor layer which has a conductivity type different from a conductivity type of the first semiconductor layer,
a light emitting layer that is provided between the first semiconductor layer and the second semiconductor layer and that generates light by having a current injected thereinto,
a first electrode electrically connected to the first semiconductor layer,
a second electrode electrically connected to the second semiconductor layer, and
a third electrode connected to the second electrode,
the second electrode transmits the light generated in the light emitting layer,
a resistivity of the third electrode is lower than a resistivity of the second electrode,
the third electrode includes a plurality of first conductive sections arranged in a first direction,
the light modulator includes
a plurality of pixels and
a gap region between the pixels adjacent to each other,
an arrangement pitch of the plurality of first conductive sections in the first direction is an integer multiple of an arrangement pitch of a plurality of the gap regions in the first direction, and
a shadow of the first conductive section generated by the light emitted from the light emitting device is cast on the gap region.

2. The projector according to claim 1, wherein
the third electrode includes a plurality of second conductive sections that are arranged in a second direction crossing the first direction,
an arrangement pitch of the plurality of second conductive sections in the second direction is an integer multiple of an arrangement pitch of the plurality of gap regions in the second direction, and
a shadow of the second conductive section generated by the light emitted from the light emitting device is cast on the gap region.

3. A projector comprising:
a light emitting device;
a light modulator modulating, in response to image information, light emitted from the light emitting device; and
a lens system directing the light emitted from the light emitting device to the light modulator, wherein
the light emitting device includes
a first semiconductor layer,
a second semiconductor layer which has a conductivity type different from a conductivity type of the first semiconductor layer,
a light emitting layer that is provided between the first semiconductor layer and the second semiconductor layer and that generates light by injection of a current,
a first electrode electrically connected to the first semiconductor layer,
a second electrode electrically connected to the second semiconductor layer, and
a third electrode connected to the second electrode,
the second electrode transmits the light generated in the light emitting layer,
a resistivity of the third electrode is lower than a resistivity of the second electrode,
the third electrode includes a plurality of first conductive sections arranged in a first direction,
the light modulator includes
a plurality of pixels and
a gap region between the pixels adjacent to each other,
an arrangement pitch of the plurality of first conductive sections in the first direction is an integer multiple of a value obtained by multiplying an arrangement pitch of a plurality of the gap regions in the first direction by a magnification of the lens system, and
a shadow of the first conductive section generated by the light emitted from the light emitting device is cast on the gap region.

4. The projector according to claim 1, wherein
the third electrode includes
a first portion in which the arrangement pitch of the plurality of first conductive sections in the first direction is a first pitch and
a second portion in which the arrangement pitch of the plurality of first conductive sections in the first direction is a second pitch smaller than the first pitch, and
in a plan view as viewed in a stacking direction of the first semiconductor layer and the light emitting layer, a distance between the second portion and a center of the second electrode is smaller than a distance between the first portion and the center of the second electrode.

5. The projector according to claim 1, wherein
the arrangement pitch of the plurality of first conductive sections in the first direction is the same as the arrangement pitch of the plurality of gap regions in the first direction.

6. The projector according to claim 5, wherein
a distance between the first conductive sections adjacent to each other is smaller than a size of the pixel in the first direction.

7. The projector according to claim 5, wherein
the light modulator includes a condensing lens directing the light emitted from the light emitting device to the pixel, and
a distance between the first conductive sections adjacent to each other is larger than a size of the pixel in the first direction.

* * * * *